United States Patent [19]
Shahid

[11] Patent Number: 4,966,645
[45] Date of Patent: Oct. 30, 1990

[54] CRYSTAL GROWTH METHOD AND APPARATUS

[75] Inventor: Muhammed A. Shahid, Ewing Township, Mercer County, N.J.

[73] Assignee: AT&T Bell Laboratories, Murray Hill, N.J.

[21] Appl. No.: 445,522

[22] Filed: Dec. 4, 1989

[51] Int. Cl.$^5$ ............................................. C30B 11/14
[52] U.S. Cl. ............................... 156/616.4; 156/616.41
[58] Field of Search ........... 156/616.4, 616.41, 620.71, 156/645; 437/226

[56] References Cited

U.S. PATENT DOCUMENTS

| | | | |
|---|---|---|---|
| 4,054,010 | 10/1977 | Shipman | 51/55 |
| 4,224,099 | 9/1980 | McGill | 156/DIG. 61 |
| 4,344,260 | 8/1982 | Ogiwara | 148/33 |
| 4,404,172 | 9/1983 | Gault | 422/248 |
| 4,488,930 | 12/1984 | Koe | 156/620.71 |
| 4,666,681 | 5/1987 | Ferrand et al. | 156/DIG. 83 |

OTHER PUBLICATIONS

"A Novel Application of the Vertical Gradient Freeze Method to the Growth of High Quality III-V Crystals," by W. A. Gault, et al., *Journal of Crystal Growth*, vol. 74, 1986, pp. 491-506.

*Primary Examiner*—Gary P. Straub
*Assistant Examiner*—Stephen G. Kalinchak
*Attorney, Agent, or Firm*—Roderick B. Anderson

[57] ABSTRACT

The major portion of the crucible in which a compound semiconductor ingot is grown has an inner surface which, in a section taken transverse to the crucible axis, substantially defines an ellipse. As a consequence, the ingot grown in the crucible has an elliptical cross-section. After the ingot is removed from the crucible, it is cut at an angle with respect to the central axis of the ingot and in the direction of the minor axis of the ellipse defining the ingot cross-section. Wafers cut from the ingot will have a circular periphery if the sine of the angle at which they are cut substantially equals $y \div x$ where y is the thickness of the ingot along the minor axis of the ellipse, and x is the thickness of the ingot along the major axis of the ellipse.

8 Claims, 3 Drawing Sheets

CRYSTAL GROWTH METHOD AND APPARATUS

TECHNICAL FIELD

This invention related to processes for making wafers of single-crystal semiconductor material, and, more particularly, to methods and apparatus for growing ingots of Group III–V and Group II–VI semiconductor compounds from which monocrystalline wafers can be cut.

BACKGROUND OF THE INVENTION

One of the most significant developments in semiconductor technology in recent years has been the increased use and importance of compound semiconductors. Particularly significant are the group III–V compounds composed of elements of groups III and V of the periodic table such as gallium arsenide and indium phosphide. Such materials are used, for example, for making lasers, light-emitting diodes, microwave oscillators and light detectors. Also promising are the II–VI materials such as cadium sulfide that may be used for making light detectors and other devices.

Most commercial use of compound semiconductors requires the growth of large single-crystal ingots from which wafers can be cut for the subsequent fabrication of useful devices. One of the more promising methods for such crystal growth is the vertical gradient freeze (VGF) method, particularly the VGF method described in the W. A. Gault, U.S. Pat. No. 4,404,172, granted Sept. 13, 1983, and in the paper, "A Novel Application of the Vertical Gradient Freeze Method to the Growth of High Quality III–V Crystals," by W. A. Gault et al., *Journal of Crystal Growth*, Vol. 74, pp. 491–506, 1986, both of which are hereby incorporated herein by reference. According to this method, raw semiconductor material is placed in a vertically extending crucible including a small cylindrical seed well portion at its bottom end which snugly contains a monocrystalline seed crystal. Initially, the raw material and a portion of the seed crystal are melted. The power to the system is then reduced in such a manner that freezing proceeds vertically upwardly from the seed crystal, with the crystal structure of the grown ingot corresponding to that of the seed crystal.

While the VGF method seems to work better than other methods for reducing the density of dislocations and other defects in the ingot, the number of imperfections in such ingots still constitutes a problem. It has been known that these often results from stresses at the interface of the crystal with the crucible and that such stresses can be reduced by growing the crystal in the <111> crystallographic direction (or, more specifically, the <111>$_B$ direction). Most semiconductor processes, however, require that the wafers from which devices are made be oriented in the <100> crystallographic direction or in a direction which is close to that direction. With the wafers oriented in the <100> direction, cutting the wafers into chips along crystallographic planes naturally forms rectangular structures, whereas if the wafers were oriented in the <111> direction, there would be a tendency to form trapezoidal or triangular structures by such processing. It is therefore customary, after growth of the ingot, to cut wafers from it at an angle with respect to the ingot central axis of about 35.3° so that the upper surfaces of such wafers lie in the appropriate crystallographic plane. Since the ingot is cylindrical, this leads to the formation of elliptically shaped wafers (the segments cut from ingots will be referred to herein as "wafers" for expediency, although such segments are sometimes known as "slices," the term "wafer" being sometimes used to refer to the slice after it has been ground and polished).

The technology of operating on semiconductor wafers to produce integrated circuit chips and other useful semiconductor devices derives from the much older silicon technology in which circular wafers are cut from cylindrical ingots. As a consequence, it is difficult to use elliptically shaped semiconductor wafers efficiently and a significant wastage of usable semiconductor wafer area inherently accompanies the use of elliptical wafers. This has long been understood as a penalty one pays for growing compound semiconductors in the <111> direction, and the belief has been that if the requirement for low defect density is sufficiently stringent, then that is a price that one must pay. Accordingly, there has been a long-felt need for a method for growing compound semiconductor ingots with a minimum of defects, but from which one can cut circular wafers.

SUMMARY OF THE INVENTION

In accordance with the invention, the major portion of the crucible in which the compound semiconductor ingot is grown has an inner surface which, in a section taken transverse to the crucible central axis, substantially defines an ellipse. As a consequence, the ingot grown in the crucible has an elliptical cross-section. After the ingot is removed from the crucible, it is cut at an angle with respect to the central axis of the ingot and in the direction of the minor axis of the ellipse defining the ingot cross-section. The wafers cut from the ingot will have a circular periphery if the sine of the angle at which they are cut substantially equals $y \div x$, where y is the thickness of the ingot along the minor axis of the ellipse, and x is the thickness of the ingot along the major elliptical axis. Thus for example, ingots grown in the <111> crystallographic direction can be cut at an angle so that the wafer surface is in the desired {100} crystallographic plane, and yet each wafer can be made to have a circular periphery. This significantly increases the usable semiconductor area of each wafer with respect to elliptical wafers from conventional cylindrical ingots.

These and other objects, features and benefits of the invention will be better understood from a consideration of the following detailed description taken in conjunction with the accompanying drawing.

DETAILED DESCRIPTION

The aforementioned Gault patent and Gault et al. publication describe in detail the apparatus to be used and procedural steps to be followed in successfully growing monocrystalline III-V semiconductor ingots in accordance with the vertical gradient freeze method. For the sake of brevity, and for the purpose of emphasizing the improvements which constitute the present invention, such details will not be repeated, it being understood that the preferred method of implementing the invention is through the use of VGF method. It should also be understood that while terms such as "monocrystalline" and "single crystal" are used to describe ingots, most ingots contain defects or localized departures from monocrystallinity, and successful growing methods are those that reduce or minimize (not necessarily eliminate) such defects.

Figure 1:
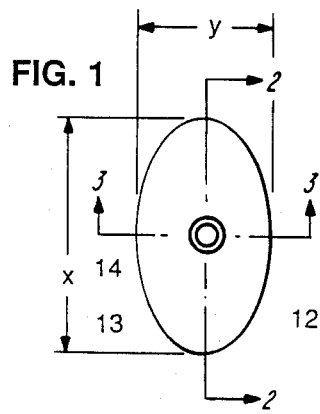
FIG. 1 is a top view of a crucible used for making semiconductor single-crystal ingots in accordance with an illustrative embodiment of the invention.
Figure 2:
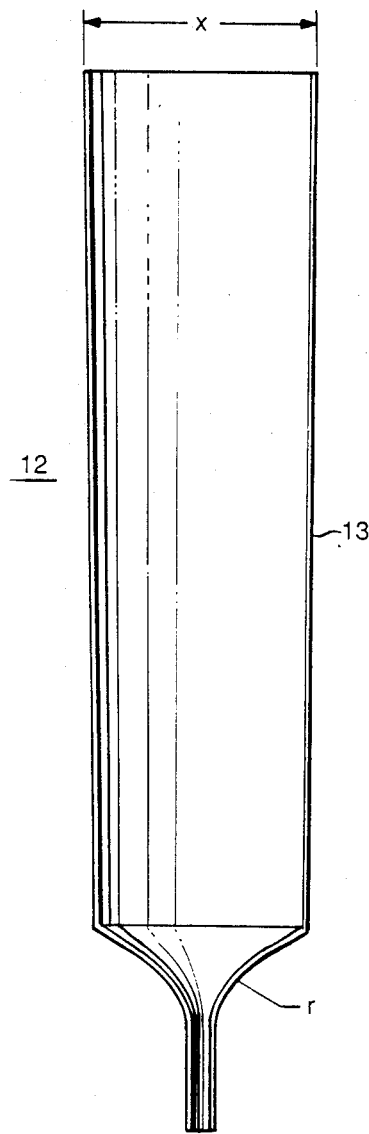
FIG. 2 is a view taken along lines 2—2 of FIG. 1.
Figure 3:
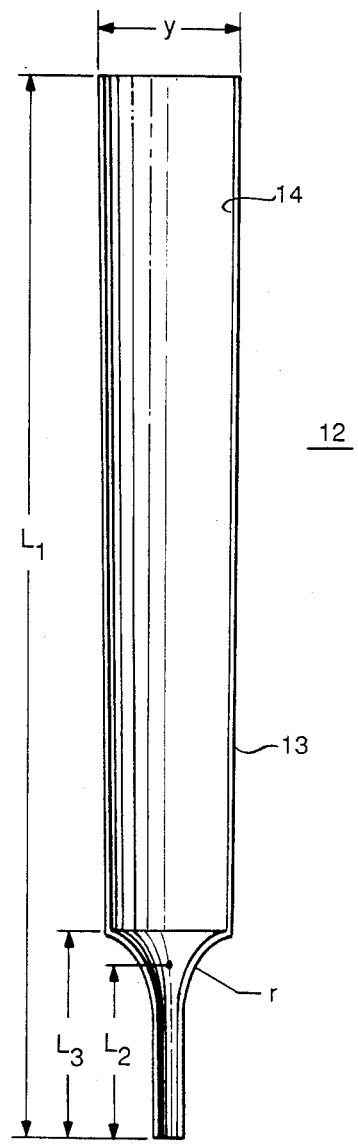
FIG. 3 is a view taken along lines 3—3 of FIG. 1.

The VGF method uses a crucible having a seed well portion, a transition portion and a cylindrical major portion which defines the shape of the ingot to be grown. Referring to FIGS. 1, 2 and 3, applicant's invention lies in the use of a crucible 12 having a major portion 13 with an inner surface 14 which, in a section taken transverse to the crucible axis, defines an ellipse as shown in FIG. 1.

For the purpose of illustrating the invention, the crucible 12 may be made of pyrolytic boron nitride having a uniform wall thickness of 0.025 inch, a total length $L_1$ of ten inches, a seed well length $L_2$ of 5/16 inch and a combined length of the seed well and transition regions $L_3$ of one and 29/32 inch. As shown in FIG. 2, the length x of the major axis of the ellipse may be 2.19 inch and as shown in FIG. 3, the length y of the minor axis of the ellipse may be 1.32 inch. As shown in FIGS. 2 and 3, the transition region has a curve of radius r between the seed well portion and the major portion. The major portion may be slightly flared to have a slightly larger cross-sectional area at its upper extremity than at its lower extremity as an aid in removing the ingot from the crucible after its growth.

Figure 4:
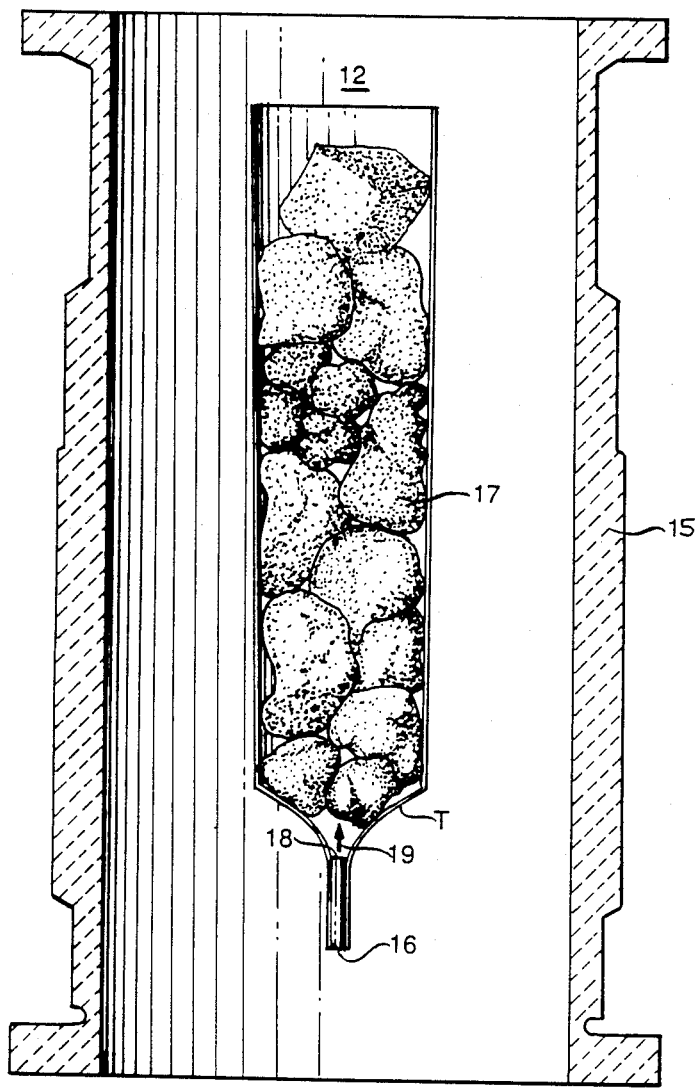
FIG. 4 is a view showing part of the seed well and transition regions of the crucible of FIG. 3 illustrating how seed crystals and raw material are loaded into such crucible.

Referring to FIG. 4, as is known in the art, a monocrystalline seed crystal 16 of the semiconductor material to be grown, such as indium phosphide, is placed in the cylindrical seed crystal portion of crucible 12. The crucible is then nearly filled with raw material from which the ingot is to be made, such as polycrystals 17 of indium phosphide. There may also be included in the crucible a quantity of boric oxide for encapsulating the molten group III-V material and there may also be included elemental group V material for maintaining the stoichiometry of the ingot during its growth.

The cylindrical seed crystal 16 is formed such that its upper surface 18 lies in the {111} crystallographic plane, in which case a direction perpendicular to surface 18, as indicated by arrow 19, constitutes the <111> direction. Under these circumstances, single crystal semiconductor material growing from surface 18 of seed crystal 16 will grow vertically upwardly in the <111> crystallographic direction indicated by arrow 19. It is customary in the growth of gallium arsenide and indium phosphide to orient the seed crystal in this manner to reduce stresses between the inner surface of the crucible and the ingot during growth, thus to minimize defects in the ingot, especially along the outer surface of the ingot.

Heat is controllably applied to the raw material by a heater 15 which surrounds the crucible. The ingot is grown by first melting the raw material 17 and part of the upper portion of seed crystal 16 and then tailoring the temperature gradient within the crucible such that recrystallization or freezing occurs first at the interface of the melt and the solid seed crystal and the progresses upwardly until the entirety of the molten raw material has recrystallized into a single ingot. Freezing results from reducing current to the heater to reduce temperature in a controlled manner. If the process is executed with protection, the ingot will be of a single crystal having a crystallographic orientation identical to that of the seed crystal 16. It is to be understood, however, that defects do occur in the growth of III-V ingots and the objective of most such growth is to reduce the density of such defects. During melting and subsequent freezing of the semiconductor material, an overpressure of gas, which may or may not include vapors of the group V element material, may be applied to the upper surface of the melt to retard the escape of vaporized group V material from the melt.

As was mentioned above, prior art VGF methods use cylindrical crucible yielding a cylindrical ingot. The ingot must then be cut at a rather severe angle with respect to its axis to give wafers having the desired crystal orientation, which results in wafers having an elliptical shape. In accordance with the invention, this problem is avoided by using the elliptically shaped crucible shown and described which, after the material has crystallized into an ingot, results in an ingot having an elliptical cross-section conforming to the elliptical section of the inner surface 14 shown in FIG. 1. When these ingots are cut at a proper angle to make wafers, the wafers will have a circular or near-circular periphery and thus will be much easier to use.

Figure 5:
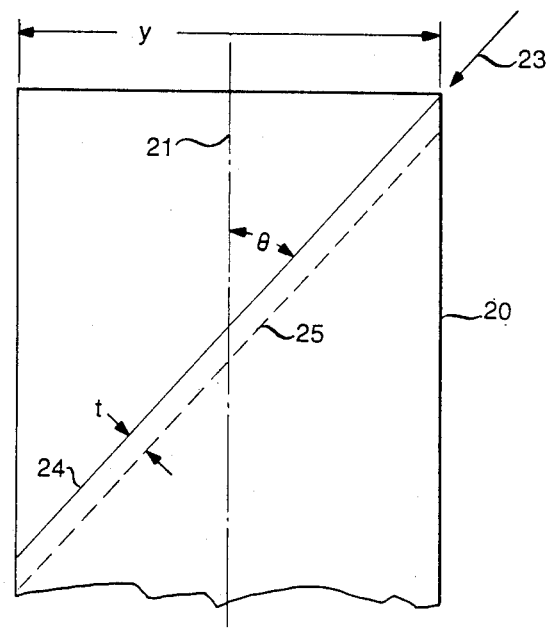
FIG. 5 is a view of part of an ingot made with the apparatus of FIG. 4.

Referring to FIG. 5, there is shown a portion of a III-V ingot 20 such as indium phosphide made in accordance with the invention. The ingot has a central axis 21 and a minor elliptical axis y corresponding to the axis y shown in FIGS. 3 and 1. The thickness of the ingot 20 along the major axis corresponds with the distance x shown in FIGS. 2 and 1. That is, with the dimensions given for the illustrative crucible, the ingot 20 would have a thickness along the axis of 2.19 inch and a thickness along the y axis of 1.32 inch.

Circular wafers are cut from the ingot 20 by cutting downwardly as shown by arrow 23 in the direction of the minor axis and at an angle $\theta$ with respect to the central axis 21. If the sine of the angle $\theta$ equals $y \div x$, where y is the length of the minor axis of the ellipse and x is the length of the major axis of the ellipse, then the resulting wafer will have a circular periphery. Thus, in accordance with the invention, if a wafer is made by cutting along a plane 24 at an angle $\theta$ whose sine is y/x, and then along a parallel plane 25 to make a wafer having a thickness t, the wafer will then have a substantially circular periphery.

As was mentioned before, if the surface 18 of the seed crystal is located such that arrow 19 of FIG. 4 extends in the <111> direction, then the central axis 21 of the ingot will likewise extend in the <111> direction. Moreover, as is known, the seed crystal should be rotated about its central axis prior to growth such that the line of insertion of the {100} plane with the {111} plane is aligned parallel to the major axis of the ellipse. To make a wafer having a surface 24 with a desired <100> crystallographic orientation, it is necessary that the angle $\theta$ be 35.3°. In our example, parameters x and are chosen such that the sine of 35.3° equals $y \div x$. The wafers thus cut have the desired <100> orientation and are generally disc-shaped with a circular periphery.

As is known, if certain epitaxial layers are to be made on the surface of the wafer, it is desirable that the wafer surface be offset from the <100> crystallographic orientation. In such cases the angle $\theta$ would deviate from 35.3° and if one wished to make exactly circular wafers, one could change the parameters x and y accordingly. It should be understood that there is no requirement that the wafers be exactly circular; indeed, elliptical ones have been used for years. One may wish to use the invention merely to reduce the deviation from circularity of cut wafers, rather than to eliminate it altogether.

I estimate that producing circular wafers using my invention requires about forty percent less material for the same number of wafers from a given length of the ingot than that required by the comparable conventional method using elliptical wafers. At current prices for the raw material this indicates a significant reduction in cost of raw material. Another way of calculating savings is in terms of the increased usable area for each wafer. Typically, fifty wafers are taken from a single ingot. Using an apportioned sum for the increased usable area of wafers, the actual cost savings may be significantly greater than that calculated merely on the savings of the cost of raw material.

Since the invention has to do with ingot geometries rather than the process of making them as such, it may be useful with processes other than the VGF process. Any process in which a crucible is used to define the outer periphery of an ingot may benefit from the use of the invention. It is well understood, moreover, that II–VI materials such as cadium sulfide may be grown by the VGF method as well as III–V semiconductor compounds and as such may make use of the invention. The invention, however, is particularly adapted for the purpose of growing indium phosphide by the VGF method, which has been shown to be most practically done by growing it in the <111> direction as has been described above. Since this is a fully developed technology, and there appears to be no adverse affects from using the invention, the invention provides clear benefits for such processes. Various other modifications and embodiments may be made by those skilled in the art without departing from the spirit and scope of the invention.

I claim:

1. A method for making wafers of a semiconductor material comprising the steps of:
   selecting a particular crystallographic orientation for the resulting wafers;
   growing an ingot of the semiconductor material in a first crystallographic direction;
   constraining growth of a major portion of the ingot such that, in a section taken perpendicularly to the first direction, the outer surface of the ingot substantially defines an ellipse having major and minor axes, the major axis being longer than the minor axis;
   and repeatedly cutting the ingot in the direction of the minor axis and at a sufficient angle with respect to the first direction to yield wafers each having a substantially circular outer periphery and having the selected crystallographic orientation.

2. The method of claim 1 further characterized in that:
   the ingot has a thickness x in the direction of the major axis of the ellipse and a thickness y in the direction of the minor axis of the ellipse;
   and the ingot is cut at such an angle that the sine of said angle substantially equals $y \div x$.

3. The method of claim 2 further characterized in that:
   the first crystallographic direction is the <111> crystallographic direction;
   and the angle at which the ingot is cut is substantially 35.3° with respect to the first direction.

4. The method of claim 3 further characterized in that:
   the semiconductor is taken from the group consisting of a group III–V semiconductor material and a group II–VI semiconductor material.

5. The method of claim 4 further characterized in that: the semiconductor is indium phosphide.

6. The method of claim 1 further characterized in that:
   the step of growing the ingot comprises the step of including in a seed well at a lower end of a crucible a seed crystal of the material to be grown;
   including over the seed crystal raw semiconductor material from which a semiconductor ingot is to be grown;
   melting the raw material and part of the seed crystal;
   and progressively freezing the molten material in an upward direction from the seed crystal to form an ingot having a central axis coincident with a central axis of the crucible.

7. The method of claim 6 wherein:
   the step of progressively freezing the molten material constitutes part of a VGF method for growing the crystal.

8. The method of claim 7 further characterized in that:
   a major portion of the crucible has an inner surface which, in a section taken perpendicularly to the crucible central axis, substantially defines an ellipse, whereby the crucible's inner surface constrains growth of a major portion of the ingot so as to have an elliptical shape.

* * * * *